(12) United States Patent
Lu et al.

(10) Patent No.: US 6,187,656 B1
(45) Date of Patent: Feb. 13, 2001

(54) CVD-BASED PROCESS FOR MANUFACTURING STABLE LOW-RESISTIVITY POLY-METAL GATE ELECTRODES

(75) Inventors: Jiong Ping Lu; Ming Hwang, both of Dallas; Dirk N. Anderson; Jorge A. Kittl, both of Plano; Hun-Lian Tsai, Dallas, all of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/167,951

(22) Filed: Oct. 7, 1998

Related U.S. Application Data
(60) Provisional application No. 60/061,557, filed on Oct. 7, 1997.

(51) Int. Cl.$^7$ .................................................. H01L 21/3205
(52) U.S. Cl. .......................... 438/592; 438/652; 438/655; 438/656
(58) Field of Search .................................. 438/592, 605, 438/652, 653, 654, 655, 656, 657, 775

(56) References Cited

U.S. PATENT DOCUMENTS

| | | | | |
|---|---|---|---|---|
| 4,663,825 | * | 5/1987 | Maeda ................................ | 438/301 |
| 5,025,295 | * | 6/1991 | Kuesters et al. .................... | 257/301 |
| 5,049,975 | * | 9/1991 | Ajika et al. ........................ | 257/764 |
| 5,298,443 | * | 3/1994 | Jang ................................... | 438/297 |
| 5,462,895 | * | 10/1995 | Chen ................................... | 438/654 |
| 5,545,592 | * | 8/1996 | Iacoponi ............................. | 438/655 |
| 5,733,816 | * | 3/1998 | Iyer et al. ........................... | 438/592 |
| 5,874,353 | * | 2/1999 | Lin et al. ........................... | 438/592 |
| 5,913,145 | * | 6/1999 | Lu et al. ............................. | 438/643 |
| 5,926,730 | * | 7/1999 | Hu et al. ............................. | 438/592 |

OTHER PUBLICATIONS

Article from IEEE Transaction on Electron Devices, vol. ED–31, No. 9, Sep. 1984, "A New Tungsten Gate Process for VLSI Applications," pp. 1174–1179 (Seichi Iwata, Naoki Yamamoto, Nobuyoshi Kobayashi, Tomoyuki Terada and Tatsumi Mizutani).

Article from IEEE Transactions on Electron Devices, vol. 43, No. 11, Nov. 1996, "Low–Resistivity Poly–Metal Gate Electrode Durable for High–Temperature Processing," pp. 1864–1869 (Yasushi Akasaka, Shintaro Suehiro, Kazuaki Nakajima, Tetsuro Nakasugi, Kiyotaka Miyano, Kunihiro Kasai, Hisato Oyamatsu, Member IEEE, Masaaki Kinugawa, Member IEEE, Mariko Takayanagi Takagi, Kenichi Agawa, Fumitomo Matsuoka, Member IEEE, Masakazu Kakumu, Member IEEE, and Kyoichi Suguro).

* cited by examiner

*Primary Examiner*—Carl Whitehead, Jr.
*Assistant Examiner*—Jeff Vockrodt
(74) *Attorney, Agent, or Firm*—Jacqueline J. Garner; W. James Brady, III; Frederick J. Telecky, Jr.

(57) ABSTRACT

A process for forming a W-poly gate stack (110) comprising the steps of: (1) deposition of doped polysilicon (112) on a thin dielectric layer (108) covered substrate (102), (2) deposition of WNx by a CVD-based process, (3) thermal treatment to covert WNx into thermally stable barrier, WSiNx, (114) and to remove excess nitrogen and (4) deposition of W layer (116). The stack layers are then etched to form the gate electrode (110).

24 Claims, 1 Drawing Sheet

CVD-BASED PROCESS FOR MANUFACTURING STABLE LOW-RESISTIVITY POLY-METAL GATE ELECTRODES

This application claims priority under 35 USC § 119 (e) (1) of provisional application Ser. No. 60/061,557, filed Oct. 7, 1997.

FIELD OF THE INVENTION

The invention is generally related to the field of semiconductor processing and more specifically to forming poly-metal gate electrode transistors.

BACKGROUND OF THE INVENTION

In sub-quarter-micron ultra-large scale integrated circuits (ULSIs), a low-resistivity gate electrode is required to reduce limitations on the speed of MOS devices due to the gate RC delay time. Tungsten (W)-poly (Si) gate structures have lower sheet resistance than conventional poly or poly-cide gates. Because W reacts with Si at temperatures as low as 600° C., it is critical to have a high quality diffusion barrier between W and Si. WN and TiN are candidates as the diffusion barriers between W and poly-Si to avoid silicidation of the W film. In conventional post-gate-etch, dry/wet oxidation is used to remove the etch damage and to improve the gate dielectric strength. The gate materials including the metal materials (W and the barrier) are subjected to the oxidation. However, under selective oxidation conditions, such as the so-called wet hydrogen oxidation (WHO) procedures (Seichi Iwata et al., IEEE Transactions on Electron Devices, Vol. ED-31, No. 9, pp. 1174–1179, Sept. 1984), W-based materials will not be oxidized while TiN barrier is still subject to oxidation. Oxidation of the barrier TiN layer can result in lift-off of the W layer. Therefore, from a low-resistivity and process integration point of view, the W-poly gate electrode without TiN is preferred.

In one prior art process (Yasushi Akasaka et al., IEEE Transactions on Electron Devices, Vol. 43, No. 11, pp. 1864–1869, Nov. 1996), a PVD process is used to fabricate a W/WN/poly-Si gate electrode. WNx films were deposited on poly-Si by reactive sputtering a W target in a gas mixture consisting of $Ar:N_2=1:1$. W films were continuously deposited by DC magnetron. However, the application of this process to MOS devices with a serious topography is limited. due to the poor step coverage of PVD films. In addition, excess nitrogen in the WNx layer needs to escape from the stack during thermal treatment. Because the thermal treatment occurs after the deposition of the W film, the escaping nitrogen from the WNx layer can cause delamination.

Accordingly, there is a need for a method of forming a barrier layer between the poly and metal of a gate electrode that overcomes the above problems.

SUMMARY OF THE INVENTION

The invention is a process for forming a metal-poly stack comprising the steps of: (1) deposition of silicon (with dopants) on a thin dielectric layer covered substrate, (2) deposition of metal-Nx by a CVD-based process, (3) thermal treatment to convert metal-Nx into a thermally stable barrier and to remove excess nitrogen and (4) deposition of metal.

An advantage of the invention is providing a process for forming a metal-poly structure that uses CVD films having better step coverage than the PVD films of the prior art.

Another advantage of the invention is providing a structure that is more stable in subsequent thermal processing due to the removal of excess nitrogen before the metal deposition.

Another advantage of the invention is providing a process for forming a structure that is compatible with selective oxidation for removing etching damage to a gate oxide.

DETAILED DESCRIPTION OF PREFERRED EMBODIMENTS

The invention is described below in conjunction with a transistor having a metal-poly gate electrode. It will be apparent to those of ordinary skill in the art that the benefits of the invention may be applied to other structures for which a barrier is desired between a silicon layer and a metal layer.

Figure 1:
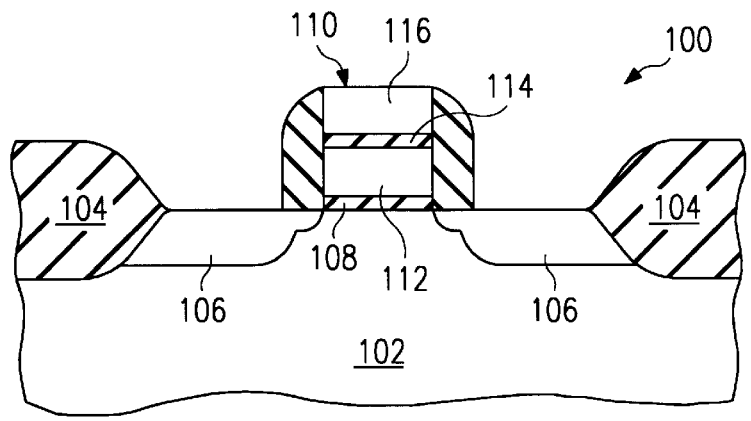
FIG. 1 is a cross-sectional diagram of a metal-poly gate transistor formed according to the invention.

A transistor 100 formed according to the invention is shown in FIG. 1. Transistor 100 is located in substrate 102 and isolated from other devices (not shown) by isolation regions 104. Conventional isolation regions include field oxide regions and shallow trench isolation. Transistor 100 is shown as having traditional diffused source/drain regions 106. The invention may instead be practiced with other types of source/drain structures, such as raised source/drain structures.

Gate dielectric 108 is located between gate stack 110 and substrate 102. Gate stack 110 comprises a silicon layer 112 adjacent gate dielectric 108, a barrier layer 114 over silicon layer 112, and a metal layer 116 over barrier layer 114. Silicon layer 112 typically comprises polysilicon, but may alternatively be an amorphous silicon. Barrier layer 114 comprises a metal-silicon-nitride such a WSiNx and serves to prevent the reaction between the polysilicon layer 112 and metal layer 116. Reaction between layers 112 and 116 unacceptably increases the sheet resistance of the structure. Preferably, the metal used in the metal-nitride of barrier layer 114 is the same metal used in metal layer 116. The preferred metal is tungsten. However, other metals such as molybendum or tantalum, may alternatively be used.

A process flow for forming the metal-poly gate stack of FIG. 1 will now be discussed with reference to FIGS. 2–5. In general, the preparation of the gate stack structure begins with the deposition of doped- silicon (normally referred to as polysilicon, although the as deposited film may be amorphous) layer 112 on a substrate 102 covered with a thin layer of dielectric 108 (such as SiOx or SiNxOy). A thin layer of metal-nitride such as WNx is then deposited by a CVD-based process. The WNx on poly 112 structure is then heat treated to form a stable barrier 114. The excess nitrogen in the WNx layer is also driven out in this step. A CVD-based process is then used to deposit a metal, such as W, layer 116 to complete the stable W/barrier/poly stack. The inventive process is described in more detail below using W as the metal layer, WSiNx as the barrier layer and polysilicon as the silicon layer.

Figure 2:
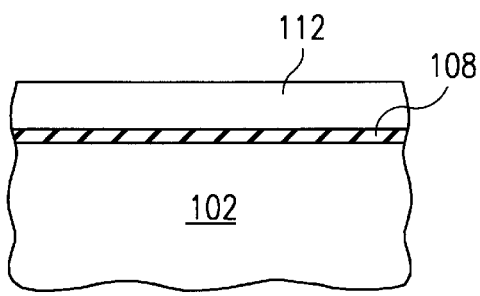
FIGS. 2–5 are cross-sectional diagrams of the metal-poly gate structure of FIG. 1 at various stages of fabrication.

The structure is processed up to gate electrode formation. This may include threshold adjusts, isolation structures, etc. as are typically performed in the art. Referring to FIG. 2, a gate dielectric layer 108 is formed over the substrate 102.

Gate dielectric layer 108 comprises dielectric materials known in the art such as SiOx or SiNxOy. Then, polysilicon layer 112 is deposited on thin gate dielectric layer 108. If the subsequent WNx deposition step is performed in the same cluster tool, no wet cleaning of the poly surface is needed. However, if the deposition of poly and subsequent WNx deposition are performed in two different tools, wet cleaning (e.g by RCA clean) and wet etching (e.g. by diluted HF solution) are suggested before the deposition of WNx.

Figure 3:
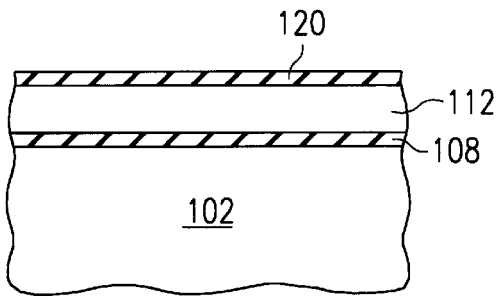

Referring to FIG. 3, a thin WNx layer 120 is formed on polysilicon layer 112. The deposition of WNx is carried out by a CVD-based process, such as PECVD, thermal CVD or photo-CVD. CVD-based processes offer better conformality than prior art PVD processes. One preferred embodiment is using PECVD with a $WF_6+H_2+N_2+Ar$ mixture. An acceptable manner of performing this step is in a CVD reactor with RF powered electrodes, such as Applied Materials' model P-5000. Example processing conditions described below are based on this reactor and actual processing conditions will vary somewhat depending on the type of CVD reactor used. Typical processing parameters used in this step are: $WF_6$ flow between approximately 2–10 sccm, $H_2$ flow between approximately 100–2000 sccm, $N_2$ flow between approximately 50–1000 sccm, Ar flow between approximately 0–2000 sccm, susceptor temperature between approximately 250–500° C., reactor pressure between approximately 0.5–10 torr, and plasma power between approximately 150–500 watt. Preferably, the processing parameters for PECVD $WN_x$ are: $WF_6$ flow of 3 sccm, $N_2$ flow of 300 sccm, $H_2$ flow of 500 sccm, Ar flow of 700 sccm, susceptor temperature of 360° C., reactor pressure of 5 torr, RF power of 375 watt and deposition time of 10 seconds. The film thickness is approximately 5 nm. In order to improve film uniformity and to minimize the chemical attack of silicon by reactive intermediate (e.g. fluorine) during CVD, the CVD process can contain an optional nitridation step before the deposition step. The nitridation step can be conveniently performed by a plasma nitridation using the same gas mixture as the deposition step described above, except that the mixture contains no $WF_6$. Other methods of nitridation can also be used, such as thermal nitridation in an ambient containing $NH_3$.

Figure 4:
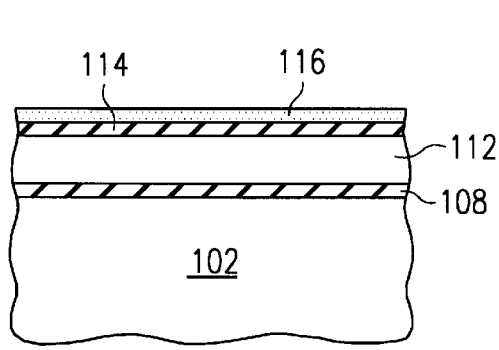

After the deposition of $WN_x$, a thermal treatment step is performed to form a stable barrier 114 and to remove excess nitrogen (see, FIG. 4). This step can be performed by using rapid thermal annealing at 800–950° C. for 15–120 seconds or in a furnace under an inert ambient, such as $N_2$, Ar, or forming gas (5% $H_2$/95% $N_2$), in the temperature range of 700–950° C. for 5–30 minutes. During the thermal treatment, $WN_x$ layer 120 reacts with poly layer 112 to form W-Si-N barrier 114. Excess nitrogen that is not used in forming the barrier is removed. If the deposition of WNx 120 is performed in a different tool as the deposition of poly 112, the poly 112 surface is typically covered with a very thin native oxide. In this case, the barrier 114 formed at the interface is W-Si-N-O. Typical thickness of the interface barrier 115 is about 3 nm.

Figure 5:
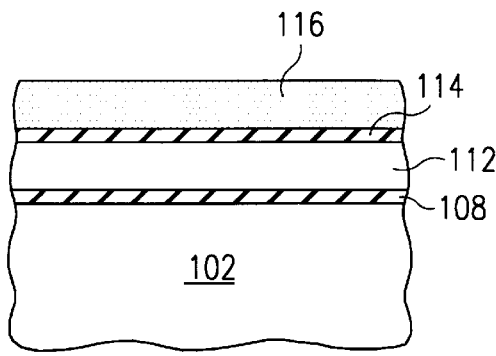

After the thermal treatment, a CVD-based process is used for deposition additional W (part of the $WN_x$ is converted to W during the thermal treatment step), as shown in FIG. 5. W deposition can be performed by thermal CVD, plasma-enhanced CVD or photo-CVD and can be performed in the same chamber that is used for depositing the $WN_x$ layer 120, thus resulting in lower cost of ownership. To encapsulate and protect the metal from later processing or to allow self-aligned contacts next to the gate, an optional dielectric layer such as silicon nitride or silicon oxide may be placed on top of the metal.

The gate stack structure prepared using the inventive method is thermally stable. No reaction between W and poly-silicon was observed for W/barrier/poly stacks that have been annealed at 850° C. for 30 minutes. The excellent thermal stability is attributed to the amorphous nature of the barrier and its high thermal stability.

Subsequent to the above processes, the W layer 116, $WSiN_x$ layer 114 and polysilicon layer 112 are patterned and etched to form the gate stack 110. Then, a selective oxidation (at 800–1000° C., for example) may be performed to oxidize the vertical edges on the polysilicon layer 112 and the substrate 102. This selective oxidation is used to heal the etch damage in the substrate and improve the gate-oxide integrity (GOI). The stability of the gate stack 110 is maintained, however, due to the fact that neither the W layer 116 nor the $WSiN_x$ barrier 114 oxidize during this step. Processing then continues as is known in the art to form the source/drain regions, interconnections (not shown), etc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit comprising the steps of:

forming a dielectric layer over a semiconductor body;

forming a silicon layer over the dielectric layer;

depositing a metal-nitride layer over the silicon layer using a chemical-vapor-deposition (CVD) process;

thermally treating said metal nitride layer to cause said metal nitride layer to react with said silicon layer to form a thermally stable barrier layer;

forming a metal layer over said barrier layer;

wherein said steps of depositing the metal nitride layer and depositing the metal layer are performed in the same chamber.

2. The method of claim 1, further comprising the step of nitridizing said silicon layer prior to the step of depositing said metal-nitride layer.

3. The method of claim 1, wherein said metal nitride layer comprises tungsten-nitride.

4. The method of claim 1, wherein said metal layer comprises tungsten.

5. The method of claim 1, wherein said metal nitride layer comprises molybdenum-nitride.

6. The method of claim 1, wherein said metal layer comprises molybendum.

7. The method of claim 1, wherein said metal nitride layer comprises tantalum-nitride.

8. The method of claim 1, wherein said metal layer comprises tantalum.

9. The method of claim 1, wherein said CVD process comprises a plasma enhanced CVD process.

10. The method of claim 1, wherein said CVD process comprises a thermal CVD process.

11. The method of claim 1, wherein said CVD process comprises a photo-CVD process.

12. The method of claim 1, further comprising the steps of:

patterning and etching said metal, barrier, and silicon layers to form a gate electrode; and selectively oxidizing said gate electrode and semiconductor body to mitigate etch damage and improve gate oxide integrity, wherein said metal and barrier layers are not oxidized.

13. The method of claim 1, wherein said step of forming said metal nitride layer comprises the following process parameters: flowing $WF_6$ at a rate in the range of 2–10 sccm, flowing $H_2$ at a rate in the range of 100–2000 sccm, flowing $N_2$ at a rate in the range of 50–1000 sccm, flowing Ar at a rate in the range of 0–2000 sccm, using a susceptor temperature in the range of 250–500° C., using a reactor pressure in the range of 0.5–10 torr, and using a plasma power in the range of 150–500 watts.

14. The method of claim 1, wherein said step of forming said metal nitride layer comprises the following process parameters: $WF_6$ flow of approximately 3 sccm, $N_2$ flow of approximately 300 sccm, $H_2$ flow of approximately 500 sccm, Ar flow of approximately 700 sccm, susceptor temperature of approximately 360° C., reactor pressure of approximately 5 torr, RF power of approximately 375 watt and deposition time of approximately 10 seconds.

15. The method of claim 1, wherein said step of thermally treating said metal nitride layer comprises the step of rapid thermal annealing at a temperature in the range of 800–950° C. for a duration in the range of 15–120 seconds.

16. The method of claim 1, wherein said step of thermally treating said metal nitride layer comprises the step of furnace annealing under an inert ambient at a temperature in the range of 700–950° C. for a duration in the range of 5–30 minutes.

17. A method of fabricating a gate electrode comprising the steps of:
  forming a gate dielectric over a substrate;
  forming a polysilicon layer over the gate dielectric;
  depositing a WNx layer on the polysilicon layer using a chemical-vapor deposition (CVD) process;
  thermally treating said WNx layer to cause said WNx layer to react with said polysilicon layer to form a thermally stable barrier layer; and
  then, forming a W layer over said barrier layer.

18. The method of claim 17, wherein said CVD process comprises a plasma enhanced CVD process.

19. The method of claim 17, wherein said CVD process comprises a thermal CVD process.

20. The method of claim 17, wherein said CVD process comprises a photo-CVD process.

21. The method of claim 17, wherein said steps of depositing the WNx layer and depositing the W layer are performed in the same chamber.

22. The method of claim 17, further comprising the steps of:
  patterning and etching said metal, barrier, and silicon layers to form a gate electrode; and
  selectively oxidizing said gate electrode and substrate to mitigate etch damage and improve gate oxide integrity, wherein said W and barrier layers are not oxidized.

23. A method of fabricating a gate electrode comprising the steps of:
  forming a gate dielectric over a substrate;
  forming a polysilicon layer over the gate dielectric;
  performing a nitridation step;
  after said nitridation step, depositing a WNx layer over the polysilicon layer using a chemical-vapor deposition (CVD) process;
  thermally treating said WNx layer to cause said metal nitride layer to react with said polysilicon layer to form a thermally stable barrier layer; and
  then, forming a W layer over said barrier layer.

24. A method of fabricating an integrated circuit comprising the steps of:
  forming a gate dielectric over a semiconductor body;
  forming a polysilicon layer over the gate dielectric;
  depositing a metal-nitride layer on the polysilicon layer using a chemical-vapor-deposition (CVD) process;
  thermally treating said metal-nitride layer to cause said metal-nitride layer to react with said polysilicon layer to form a thermally stable barrier layer; and
  then, forming a metal layer over said barrier layer, wherein said metal layer and said metal-nitride layer both comprise the same metal.

\* \* \* \* \*